United States Patent
Saito

(10) Patent No.: US 9,016,127 B2
(45) Date of Patent: Apr. 28, 2015

(54) PIEZOELECTRIC ACCELERATION SENSOR

(75) Inventor: Masuto Saito, Sendai (JP)

(73) Assignee: NEC Tokin Corporation, Sendai-shi, Miyagi (JP)

( * ) Notice: Subject to any disclaimer, the term of this patent is extended or adjusted under 35 U.S.C. 154(b) by 366 days.

(21) Appl. No.: 13/500,627

(22) PCT Filed: Sep. 28, 2010

(86) PCT No.: PCT/JP2010/066756
§ 371 (c)(1),
(2), (4) Date: Apr. 5, 2012

(87) PCT Pub. No.: WO2011/043219
PCT Pub. Date: Apr. 14, 2011

(65) Prior Publication Data
US 2012/0198936 A1    Aug. 9, 2012

(30) Foreign Application Priority Data

Oct. 7, 2009  (JP) .................................. 2009-233334

(51) Int. Cl.
*G01P 15/09*  (2006.01)
*G01P 1/02*  (2006.01)
*H01L 41/09*  (2006.01)
*H01L 41/113*  (2006.01)

(52) U.S. Cl.
CPC ............ *G01P 15/09* (2013.01); *H01L 41/0933* (2013.01); *H01L 41/1132* (2013.01); *H01L 41/1136* (2013.01)

(58) Field of Classification Search
CPC ....... G01P 15/09; G01P 15/125; G01P 15/18; H01L 41/1132
USPC .............................................. 73/514.34, 493
See application file for complete search history.

(56) References Cited

U.S. PATENT DOCUMENTS

| 5,574,221 A | 11/1996 | Park et al. |
| 6,360,603 B1 * | 3/2002 | Tabota ...................... 73/514.34 |
| 6,629,462 B2 | 10/2003 | Otsuchi et al. |

FOREIGN PATENT DOCUMENTS

| CN | 1334465 A | 2/2002 |
| CN | 201402238 Y | 2/2010 |

(Continued)

OTHER PUBLICATIONS

Chinese Office Action dated Nov. 29, 2013 (and English translation thereof) in counterpart Chinese Application No. 201080045095.9.
Chinese Office Action dated Mar. 27, 2013 (and English translation thereof) in counterpart Chinese Application No. 201080045095.9.
International Search Report (ISR) dated Nov. 9, 2010 (and English translation thereof) in International Application No. PCT/JP2010/066756.

(Continued)

*Primary Examiner* — Helen Kwok
(74) *Attorney, Agent, or Firm* — Holtz, Holtz, Goodman & Chick PC

(57) ABSTRACT

A piezoelectric acceleration sensor comprises a piezoelectric element, a metallic sheet and a circuit board. The piezoelectric element is polarized in a predetermined direction. The circuit board includes a circuit portion and a roughly flat shaped base portion. The base portion protrudes from an end portion of the circuit portion. One of surfaces of the metallic sheet is fixed to and supported by a surface of the base portion. The piezoelectric element is fixed to and supported by a remaining one of the surfaces of the metallic sheet in a manner that the piezoelectric element and the base portion do not overlap each other in the predetermined direction.

10 Claims, 5 Drawing Sheets

(56) References Cited

FOREIGN PATENT DOCUMENTS

| | | |
|---|---|---|
| JP | 58-178225 A | 10/1983 |
| JP | 62-42330 | 3/1987 |
| JP | 2-16613 U | 2/1990 |
| JP | 5-80027 | 10/1993 |
| JP | 9-026431 A | 1/1997 |
| JP | 9-196965 A | 7/1997 |
| JP | 10-142079 A | 5/1998 |
| JP | 10-260203 A | 9/1998 |
| JP | 2000-121661 A | 4/2000 |
| JP | 2003-156508 A | 5/2003 |
| JP | 2006-023287 A | 1/2006 |

OTHER PUBLICATIONS

Japanese Office Action dated May 10, 2012 (and English translation thereof) in counterpart Japanese Application No. 2011-535351.
Japanese Office Action dated Oct. 11, 2012 (and English translation thereof) in counterpart Japanese Application No. 2011-535351.
Japanese Office Action dated Jul. 26, 2012 and English translation thereof in counterpart Japanese Application No. 2011-535351.
Chinese Office Action dated Jun. 3, 2014 issued in counterpart Chinese Application No. 201080045095.9.
Taiwanese Office Action dated Nov. 10, 2014, issued in counterpart Taiwanese Application No. 099133928.

\* cited by examiner

US 9,016,127 B2

PIEZOELECTRIC ACCELERATION SENSOR

This application is a U.S. National Phase Application under 35 USC 371 of International Application PCT/JP2010/066756 filed Sep. 28, 2010.

TECHNICAL FIELD

This invention relates to a piezoelectric acceleration sensor which is used for a purpose such as detecting vibrations. Especially, this invention relates to a preferable support structure of a piezoelectric vibrator which is used in the piezoelectric acceleration sensor.

BACKGROUND ART

Recently, more and more electronic equipments become to be installed in a DVD/BD recorder, a television, a portable equipment or the like. Moreover, the precision of the installed electronic equipment is improved. Demands on reliability of the electronic equipment are continuously increasing. It is required a low-price and reduced-size acceleration sensor having high output sensitivity of 100 mV/G or more in order to detect impact applied to the electronic equipment or vibration which the electronic equipment itself generates.

As for a means to detect acceleration, various methods are conventionally suggested or put into use. Especially, a bending-type piezoelectric acceleration sensor (hereinafter, simply refers to as "a piezoelectric acceleration sensor"), which uses bending of a piezoelectric ceramics, is uses extensively because of its simple structure and easiness to reduce its price.

Output sensitivity which results from the bending of the piezoelectric ceramics is theoretically limited to about a few mV/G at most. Therefore, it is necessary to amplify the output from the piezoelectric ceramics finally so as to obtain output sensitivity of 100 mV/G or more. Moreover, it is important to amplify the output sensitivity while keeping the size of the piezoelectric ceramics small.

Because of this, various structures to support piezoelectric ceramics are suggested. For example, a piezoelectric ceramics of Patent Document 1 is supported in a cantilever structure by a side surface of a storage case. A piezoelectric ceramics of Patent Document 2 is supported in a both-ends support structure by a bottom surface of a storage case. Patent Document 3 discloses a technology that the vicinity of each of opposite ends of a piezoelectric vibrator and the middle part of the piezoelectric vibrator are polarized in opposite directions to each other. Moreover, the piezoelectric vibrator is supported in a both-ends support structure so that output sensitivity is improved.

PRIOR TECHNICAL DOCUMENT(S)

Patent Document(s)

Patent Document 1: JP-A H5-505236
Patent Document 2: JP-A H9-26431
Patent Document 3: JP-A 2000-121661

DISCLOSURE OF INVENTION

Problem(s) to be Solved by the Invention

However, enough output sensitivity is not gotten by any means suggested hitherto. Moreover, when the supporting structure disclosed in Patent Document 1 or Patent Document 2 is adopted, it is impossible to do performance test until the piezoelectric ceramics is installed in the storage case (i.e. until production of the piezoelectric acceleration sensor is almost done). When the technology of Patent Document 3 is adopted, complicated processes are required to polarize the piezoelectric vibrator.

It is therefore an object of the present invention to provide a piezoelectric acceleration sensor which has high output sensitivity and superior mass productivity while having a reduced size.

Means to Solve the Problem

One aspect of the present invention provides a piezoelectric acceleration sensor. The piezoelectric acceleration sensor comprises a piezoelectric element, a metallic sheet and a circuit board. The piezoelectric element is polarized in a predetermined direction. The circuit board includes a circuit portion and a roughly flat shaped base portion. The base portion protrudes from an end portion of the circuit portion. One of surfaces of the metallic sheet is fixed to and supported by a surface of the base portion. The piezoelectric element is fixed to and supported by a remaining one of the surfaces of the metallic sheet in a manner that the piezoelectric element and the base portion do not overlap each other in the predetermined direction.

Effect(s) of the Invention

According to the present invention, a piezoelectric ceramics is supported by a structure different from the existing structures so that it is possible to obtain a piezoelectric acceleration sensor which has high output sensitivity while having a reduced size. Moreover, the piezoelectric acceleration sensor according to the present invention has superior mass productivity.

EMBODIMENT(S) FOR CARRYING OUT THE INVENTION

Hereinafter, embodiments of the present invention are described in detail. When a direction such as "upper", "lower", "left" or "right" is shown in the following description, the direction does not indicate an absolute position of a component or the like but only indicate a relative position in each of Figures.

First Embodiment

Figure 1:
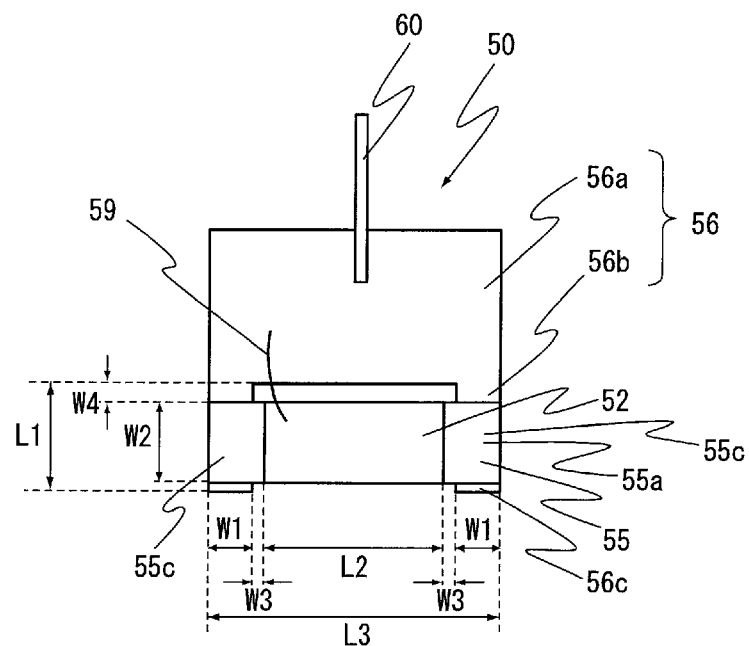
FIG. 1 A plan view showing a piezoelectric acceleration sensor according to a first embodiment of the present invention.
Figure 2:
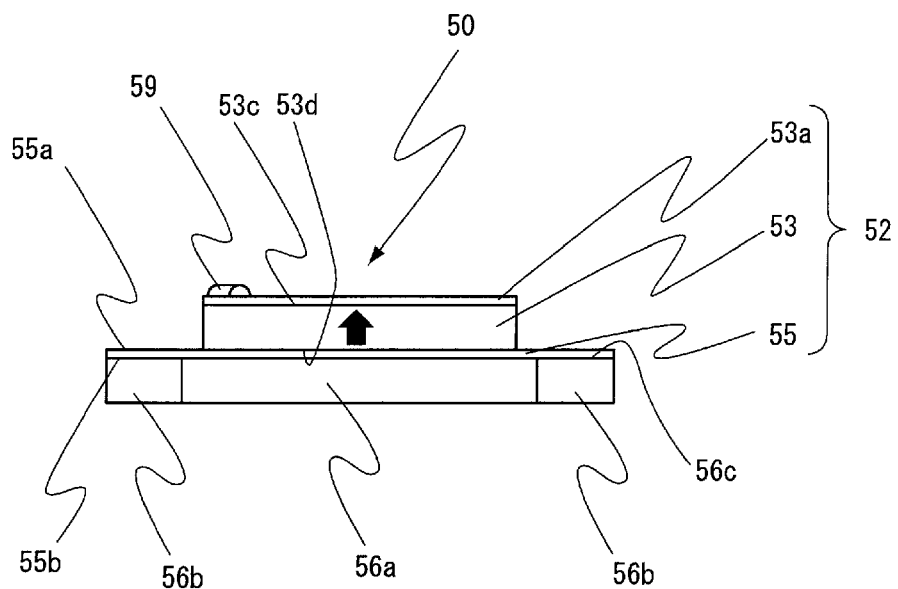
FIG. 2 A front view showing the piezoelectric acceleration sensor of FIG. 1.

As shown in FIGS. 1 and 2, a piezoelectric acceleration sensor 50 according to a first embodiment of the present invention comprises a circuit board 56, a lead 59, an output cable 60, a piezoelectric ceramic plate (piezoelectric element) 53 and a metallic sheet 55.

The circuit board 56 includes a circuit portion 56a and base portions 56b. The circuit portion 56a is formed in a rectangular flat shape. The base portion 56b is formed in a rectangular flat shape. The base portion 56b protrudes from an end portion of the circuit portion 56a. According to the present embodiment, the two base portions 56b project in parallel to each other in a common plane from in the vicinity of opposite end portions of one side of the circuit portion 56a, respectively. In other words, the circuit board 56 is formed in a U-like shape by cutting a middle part of one side of a rectangular circuit board. The circuit portion 56a has an amplifier circuit or the like installed thereon. The lead 59 and the output cable 60 are connected to the amplifier circuit or the like by soldering or the like. Each of the two base portions 56b has a conductive portion on at least a part of an upper surface 56c. This conductive portion is electrically connected with the amplifier circuit or the like of the circuit portion 56a.

The piezoelectric ceramic plate 53 is made of a piezoelectric material such as a lead zirconate titanate (PZT) and formed in a rectangular plate-like shape. The piezoelectric ceramic plate 53 is polarized uniformly in a direction (upper-to-lower direction) indicated by black arrow shown in FIG. 2. The piezoelectric ceramic plate 53 has two principal surfaces 53c and 53d which are opposite to each other in the polarized direction (predetermined direction). A silver paste or the like is coated on the one principal surface 53c of the piezoelectric ceramic plate 53 so that the principal surface 53c is formed with an upper electrode 53a. The lead 59 is connected to the upper electrode 53a by soldering or the like.

The metallic sheet 55 has two plate surfaces (an upper surface 55a and a lower surface 55b). The principal surface 53d of the piezoelectric ceramic plate 53 is glued and fixed to the upper surface 55a by a conductive adhesive or the like. In other words, the upper surface 55a supports and fixes the piezoelectric ceramic plate 53. The piezoelectric ceramic plate 53 having the upper electrode 53a, and the metallic sheet 55 constitute a unimorph piezoelectric vibrator (electromechanical transducer element) 52 which serves as an acceleration sensing element.

Opposite ends in a lengthwise direction (left-to-right direction in FIG. 1 or 2) of the metallic sheet 55 protrude outward in the lengthwise direction from opposite ends in the lengthwise direction of the piezoelectric ceramic plate 53, respectively. Each of these two protruding parts (supported portions 55c) is glued and fixed to the upper surface 56c of the base portion 56b by a conductive adhesive or the like. In other words, the lower surface 55b which is one of surfaces of the supported portion 55c is fixed to and supported by the upper surface 56c which is a surface of the base portion 56b. The metallic sheet 55 is electrically connected with the amplifier circuit or the like of the circuit portion 56a through the base portion 56b.

As described above, the piezoelectric vibrator 52 is supported by the two base portion 56b in a both-ends support structure. As shown in FIGS. 1 and 2, the piezoelectric ceramic plate 53 and the base portion 56b do not overlap each other in the polarized direction. Therefore, the piezoelectric ceramic plate 53 is able to be bent entirely in the upper-to-lower direction (polarized direction).

Figure 3:
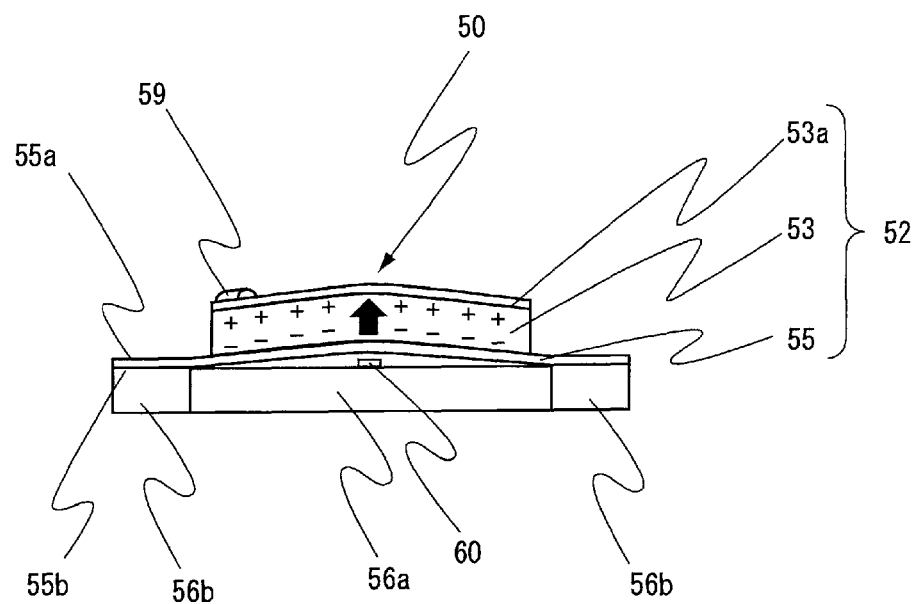
FIG. 3 A front view showing the piezoelectric acceleration sensor of FIG. 1 in a state where it is bent by acceleration.

When the piezoelectric acceleration sensor 50 receives acceleration, the piezoelectric vibrator 52 receives an inertial force proportional to the acceleration. For example, when acceleration along the polarized direction (vertical direction in FIG. 2) is applied to the piezoelectric acceleration sensor 50, as shown in FIG. 3, a central part of the piezoelectric vibrator 52 in the lengthwise direction is bent upwardly (bent in the polarized direction). As a result, electric charges having opposite signs are generated on the upper electrode 53a and the metallic sheet 55 of the piezoelectric vibrator 52, respectively. In other words, a voltage proportional to the acceleration is generated between the upper electrode 53a and the metallic sheet 55. The generated voltage is supplied to the amplifier circuit on the circuit portion 56a through the lead 59 and base portion 56b. The voltage (output signal) amplified by the amplifier circuit is sent to the outside of the piezoelectric acceleration sensor 50 by the output cable 60. It is possible to get the value of the acceleration applied to the piezoelectric acceleration sensor 50 by measuring the voltage sent to the outside.

Figure 10:
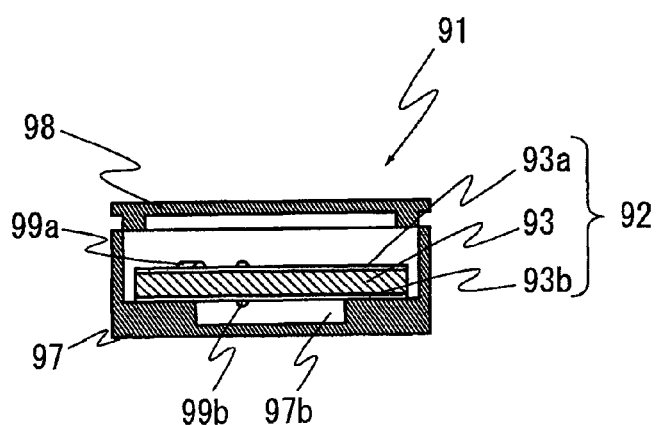
FIG. 10 A cross-sectional view showing the piezoelectric acceleration sensor of FIG. 9, taken along X-X lines.

As shown in FIG. 10, as for an existing piezoelectric acceleration sensor 91, a part of a piezoelectric ceramic plate 93 is fixed to be supported. Therefore, when a middle part of the piezoelectric ceramic plate 93 is bent, a part of the piezoelectric ceramic plate 93, which is located near the supported and fixed part, is bent so as to face away from the middle part. In other words, an inflection point appears on the piezoelectric ceramic plate 93. As a result, electric charges having opposite signs are generated on the middle part and the part about the inflection point, respectively, so that the electric charges are canceled. It seems that output sensitivity is lowered accordingly.

On the other hand, the piezoelectric ceramic plate 53 according to the present embodiment is not directly fixed to the base portion 56b. Therefore, when the piezoelectric ceramic plate 53 is bent by the acceleration, it is possible to prevent its output sensitivity from being lowered because of the appearance of the inflection point on the piezoelectric ceramic plate 53.

Especially, as shown in FIG. 1, opposite ends in the lengthwise direction of the piezoelectric ceramic plate 53 are a predetermined distance W3 apart from the respective base portions 56b as seen along the polarized direction so that the piezoelectric ceramic plate 53 may be bent to one side by the acceleration. Conversely, as for the value of the predetermined distance W3, it is preferable to adopt such a value so that the piezoelectric ceramic plate 53 is bent to one side by the acceleration while taking the thickness of the piezoelectric ceramic plate 53 or the like into consideration. As described above, the piezoelectric ceramic plate 53 is located to be a proper distance apart from the base portion 56b so that the inflection point may appear not on the piezoelectric ceramic plate 53 but on the supported portion 55c of the metallic sheet 55. Therefore, the output sensitivity relative to the acceleration is more improved. According to the present embodiment, the length L2 of the piezoelectric ceramic plate 53 is required to meet following Expression 1 in relation to the distance L3 between the left and right ends of the two base portions 56b and the width W1 of the base portion 56b so that the predetermined distance W3 can be more than zero.

$$(L3-L2)/2 > W1 \qquad \text{(Expression 1)}$$

However, if the value of the predetermined distance W3 is too large, vibration caused by the acceleration is absorbed into the metallic sheet 55. In detail, when the acceleration changes, a part of the metallic sheet 55, which is located between the end of the piezoelectric ceramic plate 53 in the lengthwise direction and the base portion 56b, vibrates. As a result, the piezoelectric ceramic plate 53 is not bent enough so that the output sensitivity is lowered. Therefore, the value of the predetermined distance W3 is required to be designed so that the undesirable vibration on the metallic sheet 55 is not practically caused by the acceleration.

As shown in FIG. 1, according to the present embodiment, distances between the two base portions 56b and the respective ends in the lengthwise direction of the piezoelectric ceramic plate 53 are same (the predetermined distance W3) as each other. By doing this, the piezoelectric ceramic plate 53 is supported equally by the two base portions 56b, and the piezoelectric ceramic plate 53 is bent symmetrically about a middle part thereof in the lengthwise direction. Therefore, the output sensitivity is more improved.

As for the piezoelectric acceleration sensor 50 according to the present embodiment, the supported portion 55c of the metallic sheet 55 does not protrude from the base portion 56b in a width direction. In other words, as shown in FIG. 1, the supported portion 55c is located near the circuit portion 56a as compared with a head of the base portion 56b. By adopting the aforementioned supporting structure, undesirable vibration of the base portion 56b caused by the vibration of the piezoelectric vibrator 52 is reduced so that a stable output is obtained from the piezoelectric acceleration sensor 50. The length L1 of the base portion 56b and the width W2 of the metallic sheet 55 are required to meet following Expression 2 so that the aforementioned structure can be adopted.

$$L1 > W2 \quad \text{(Expression 2)}$$

For example, when the piezoelectric acceleration sensor 50 receives an upward acceleration in FIG. 1, the piezoelectric vibrator 52 is bent toward the circuit portion 56a. If there is a possibility where the piezoelectric vibrator 52 is bent toward the circuit portion 56a like this, it is better that the metallic sheet 55, which supports and fixes the piezoelectric vibrator 52, is located to be apart from the circuit portion 56a so as not to be brought into contact with the circuit portion 56a in a case where the metallic sheet 55 is bent by the acceleration. In other words, as shown in FIG. 1, it is better to design the distance W4 between the piezoelectric vibrator 52 and the circuit portion 56a so that the piezoelectric vibrator 52 and the circuit portion 56a are not brought into contact with each other under expected operating conditions. The length L1, the width W2 and the distance W4 are required to meet following Expression 3 so that the distance W4 can be designed like that.

$$L1 > W2 + W4 \quad \text{(Expression 3)}$$

As described above, the piezoelectric acceleration sensor 50 according to the present embodiment has superior output sensitivity while having a reduced size because the electric charges generated in the piezoelectric vibrator 52 are not canceled.

Figure 9:
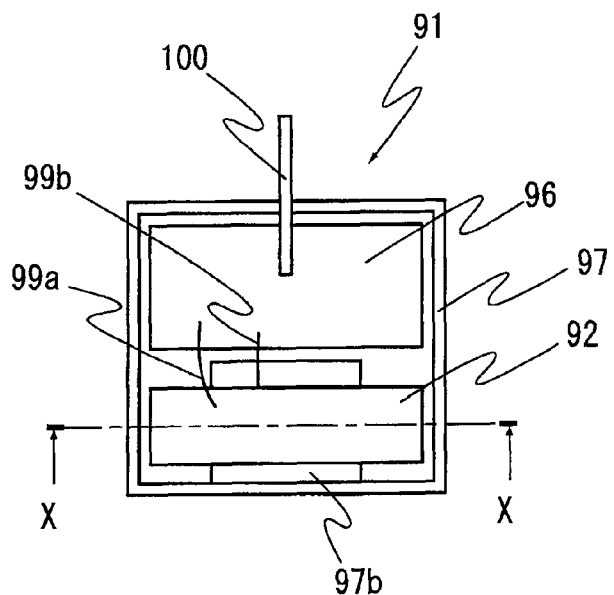
FIG. 9 A plan view showing an existing piezoelectric acceleration sensor in a state where its case-cover is removed.

As shown in FIGS. 9 and 10, the existing piezoelectric acceleration sensor 91 needs two leads 99a and 99b in order to electrically connect an upper electrode 93a and a lower electrode 93b of a piezoelectric vibrator 92 to an amplifier circuit installed on a circuit board 96. On the other hand, as for the piezoelectric acceleration sensor 50 according to the present embodiment, the metallic sheet 55 is directly connected to the conductive portion of the base portion 56b. Accordingly, the number of lead of the piezoelectric acceleration sensor 50 is one. Therefore, it is possible to reduce manufacturing processes and quality variations.

Second Embodiment

Figure 4:
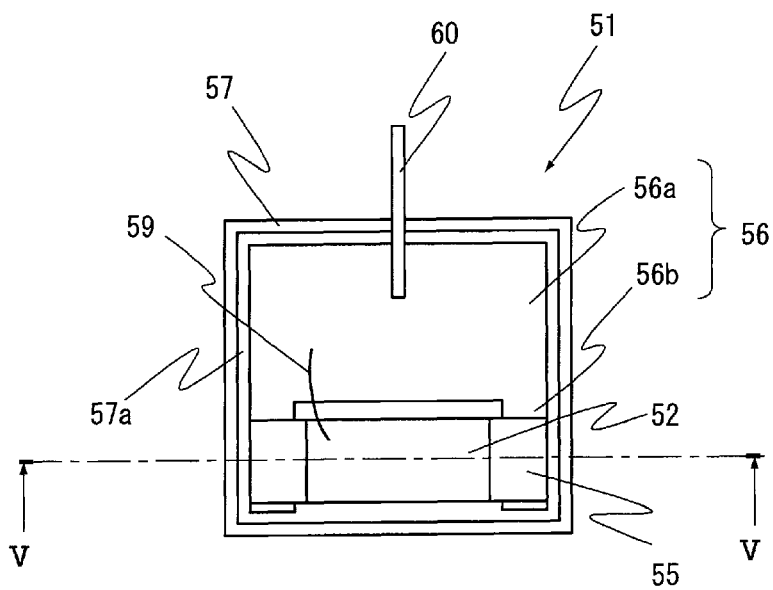
FIG. 4 A plan view showing a piezoelectric acceleration sensor according to a second embodiment of the present invention in a state where its case-cover is removed.
Figure 5:
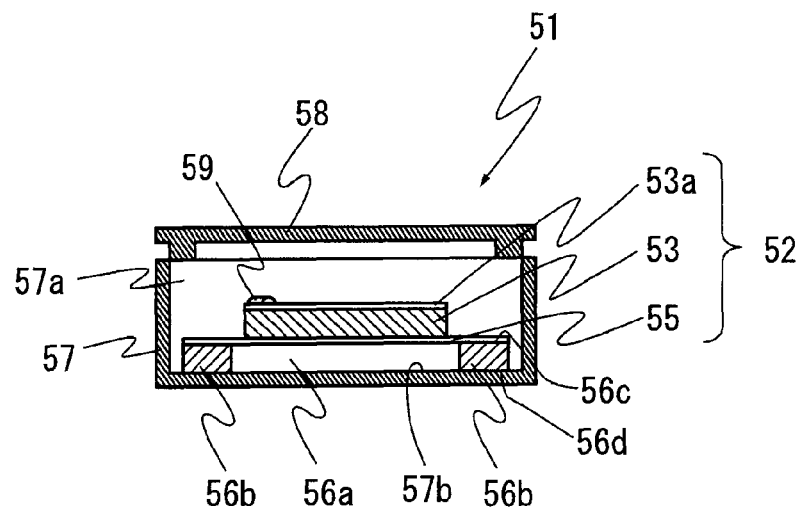
FIG. 5 A cross-sectional view showing the piezoelectric acceleration sensor of FIG. 4, taken along V-V lines.

As shown in FIGS. 4 and 5, a piezoelectric acceleration sensor 51 according to a second embodiment of the present invention is configured so that the piezoelectric acceleration sensor 50 according to the first embodiment is accommodated within a case 57.

The case 57 is made of a material which has such stiffness that deformation due to expected acceleration does not occur. The inside of the case 57 is formed with an accommodating space 57a having a support surface 57b. The accommodating space 57a is formed in a size so as to be able to accommodate the circuit board 56 under a state where the piezoelectric vibrator 52 is fixed to and supported by the circuit board 56. The circuit portion 56a and the base portion 56b of the circuit board 56 are adhered to the support surface 57b by a thermosetting epoxy resin or the like so that the support surface 57b is perpendicular to the polarized direction. In other words, a lower surface 56d (opposite surface which is opposite, in the polarized direction, to the upper surface 56c which supports the metallic sheet 55) of the base portion 56b is fixed to and supported by the support surface 57b.

As shown in FIG. 5, a case-cover 58 is fixed to the case 57 by press-fitting or the like under a state where the circuit board 56 and the piezoelectric vibrator 52 are accommodated in the accommodating space 57a. As shown in FIG. 4, the output cable 60 extends to the outside of the case 57.

Similar to the piezoelectric acceleration sensor 50, when the piezoelectric acceleration sensor 51 receives acceleration, a voltage is generated by bending of the piezoelectric ceramic plate 53, and the generated voltage is amplified by the amplifier circuit. The amplified voltage is sent to the outside of the piezoelectric acceleration sensor 51 by the output cable 60.

The piezoelectric vibrator 52 of the piezoelectric acceleration sensor 51 is fixed to and supported by not the case 57 but the base portion 56b. Therefore, it is possible to do performance test only by combining the piezoelectric vibrator 52 with the circuit board 56 before the circuit board 56 and the piezoelectric vibrator 52 are accommodated in the accommodating space 57a of the case 57.

Moreover, the case 57 does not need to be provided with a ditch in which the piezoelectric vibrator 52 is bent so that the support surface 57b of the case 57 can be formed in a planar shape without irregularities. Therefore, it becomes possible to make a thickness of the support surface 57b of the case 57 thinner than previously so that it is possible to make the case 57 smaller.

Figure 6:
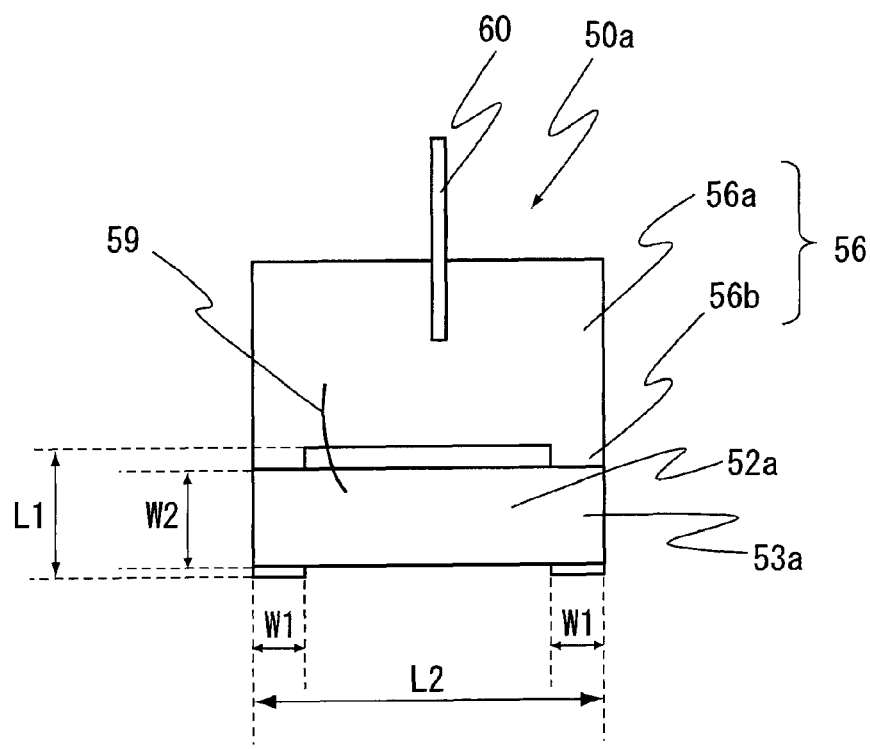
FIG. 6 A plan view showing a piezoelectric acceleration sensor wherein a piezoelectric element is supported directly by a circuit board.
Figure 7:
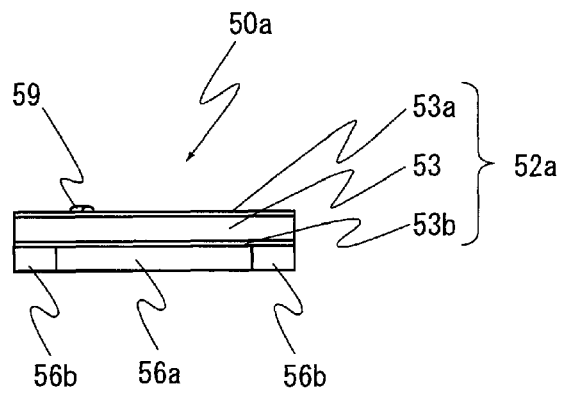
FIG. 7 A front view showing the piezoelectric acceleration sensor of FIG. 6.

A Modification of the first embodiment or the second embodiment is shown in FIGS. 6 and 7. A piezoelectric vibrator 52a of the present modification is formed with the upper electrode 53a and a lower electrode 53b, each made of a silver paste or the like, on the two principal surfaces perpendicular to the polarized direction of the piezoelectric ceramic plate 53, respectively. The piezoelectric vibrator 52a does not include the metallic sheet 55. Opposite end portions in the lengthwise direction of the lower electrode 53b of the piezoelectric vibrator 52a are fixed to and supported by the base portions 56b, respectively. Accordingly, the lower electrode 53b of the piezoelectric vibrator 52a is electrically connected with the amplifier circuit or the like of the circuit portion 56a through the conductive portion of the base portion 56b.

Except for the aforementioned structures, a piezoelectric acceleration sensor 50a is configured similar to the piezoelectric acceleration sensor 50.

Similar to the piezoelectric acceleration sensor 50, the piezoelectric acceleration sensor 50a can be accommodated within the case 57 so as to be used.

For example, the piezoelectric acceleration sensor 50a may be used when improvement of the output sensitivity is not so important while it is important to reduce the size of the case 57 and to do performance test before accommodated in the case 57.

MODIFICATIONS

Figure 8:
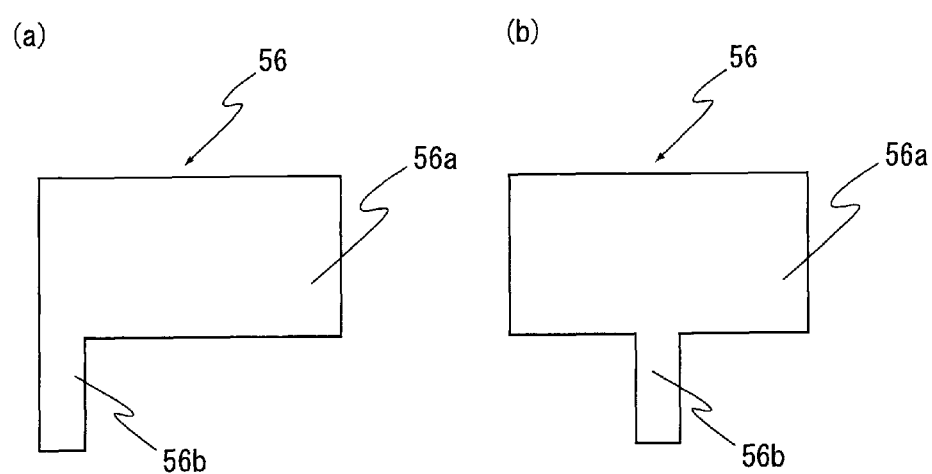
FIG. 8 Plan views showing respective modifications of a circuit board of a piezoelectric acceleration sensor.

It is possible to variously modify the piezoelectric acceleration sensor 50, the piezoelectric acceleration sensor 50a or the piezoelectric acceleration sensor 51. For example, as shown in FIG. 8(a), the circuit board 56 may not have the U-like shape but have an L-like shape formed by cutting an end portion of one side of its rectangular shape. The L-like shaped circuit board 56 may support the piezoelectric vibrator 52 or 52a by a cantilever structure. As shown in FIG. 8(b), the circuit board 56 may have a T-like shape formed by cutting opposite end portions of one side of its rectangular shape. The T-like shaped circuit board 56 may support the piezoelectric vibrator 52 or 52a by a central-supporting structure. Especially, when the piezoelectric acceleration sensor 50a is modified to have the cantilever structure or the central-supporting structure, it becomes possible to improve the output sensitivity as compared with the both-ends support structure. In addition to the above, the shape of the circuit portion 56a or the base portion 56b can be modified variously.

The piezoelectric vibrator 52 is not limited to be a unimorph-type. The piezoelectric vibrator 52 may be a bimorph-type or another type. Moreover, the shape of the metallic sheet 55 is not limited to a rectangular shape. It is possible to adopt various shapes supportable the piezoelectric vibrator 52.

The supporting structure of the piezoelectric vibrator 52, the thickness and the size of the metallic sheet 55, etc. may be selected based on the specifications such as desirable output sensitivity, frequency band expected to be used and durability against impact force.

EXAMPLE(S)

Here is described about the piezoelectric acceleration sensor according to the present invention based on specific examples.

Example 1

An example of the piezoelectric acceleration sensor 50a shown in FIG. 6 was made and accommodated within the case 57. Specifically, the piezoelectric ceramic plate 53 having the length L2 of 6.0 mm of the principal surface, the width W2 of 2.0 mm and the height of 0.3 mm was made of a PZT material. The upper electrode 53a and the lower electrode 53b, each made of a silver, were uniformly formed on a pair of the principal surfaces of the piezoelectric ceramic plate 53 so that the piezoelectric vibrator 52a was made. In addition, the circuit board 56 having thickness of 0.5 mm was made of an alumina material. The circuit board 56 is formed in a U-like shape as a whole. In detail, the base portions 56b each having a rectangular shape of 2.5 mm×0.5 mm are integrally provided at opposite ends of the circuit portion 56a having a rectangular shape of 6.0 mm×3.0 mm. A general amplifier circuit using Field Effect Transistor (FET) is installed on the circuit portion 56a. The base portion 56b is provided with a connecting terminal thereon. The connecting terminal is electrically connected to the amplifier circuit on the circuit portion 56a.

Then, the piezoelectric vibrator 52a was glued on the base portion 56b with a conductive adhesive so that, as shown in FIG. 6, the both-ends support structure was formed. The connecting terminal of the base portion 56b and the lower electrode 53b of the piezoelectric vibrator 52a were electrically connected with each other by this gluing.

The resonant frequency of the piezoelectric vibrator 52a supported by the aforementioned structures was about 65 kHz.

Then, an end of the lead 59 was soldered to be connected to the upper electrode 53a of the piezoelectric vibrator 52a while the other end of the lead 59 was soldered to be connected to the circuit portion 56a so that the upper electrode 53a and the amplifier circuit were electrically connected with each other. In addition, the output cable 60, which was a single-core coaxial cable, was soldered to be connected to the circuit portion 56a. The output cable 60 is used to supply power current to the amplifier circuit and to send out signals.

Finally, the case 57, which has enough size to accommodate the circuit board 56, and the case-cover 58 were made of an austenitic stainless steel (SUS304) material. The circuit board 56 to which the piezoelectric vibrator 52 was glued and fixed was glued to the case 57 by a thermosetting epoxy resin. The case-cover 58 was fixed to the case 57 by press-fitting so that the piezoelectric acceleration sensor was made.

As for the piezoelectric acceleration sensor 50a of Example 1, when comparing the length L1 of the base portion 56b and the width W2 of the piezoelectric vibrator 52a, the relation L1>W2 is satisfied because L1 is equal to 2.5 mm and W2 is equal to 2.0 mm.

Example 2

An example of the piezoelectric acceleration sensor 50 shown in FIG. 1 was made and accommodated within the case 57. Specifically, the unimorph-type piezoelectric vibrator 52 comprising the piezoelectric ceramic plate 53 and the metallic sheet 55 was made. The piezoelectric ceramic plate 53 is made of a PZT material and has the length L2 of 4.5 mm of the principal surface, the width W2 of 2.0 mm and the height of 0.3 mm. The metallic sheet 55 is made of a phosphor bronze material and has the length L3 of 6.0 mm of its principal surface, the width W2 of 2.0 mm and the height of 0.1 mm. The shape of the circuit board 56 or the like is same as Example 1.

Then, the piezoelectric vibrator 52 was glued on the base portion 56b with a conductive adhesive so that, as shown in FIG. 1, the both-ends support structure was formed. The connecting terminal of the base portion 56b and the metallic sheet 55 of the piezoelectric vibrator 52 were electrically connected with each other by this gluing.

The resonant frequency of the piezoelectric vibrator 52 supported by the aforementioned structures was about 55 kHz.

Then, each of the lead 59 and the output cable 60 was connected similar to Example 1.

Finally, the case 57, which has enough size to accommodate the circuit board, and the case-cover 58 were made of an SUS304 material. The circuit board 56 to which the piezoelectric vibrator 52 was glued and fixed was glued to the case 57 by a thermosetting epoxy resin. The case-cover 58 was fixed to the case 57 by press-fitting so that the piezoelectric acceleration sensor was made.

As for the piezoelectric acceleration sensor 50 of Example 2, when comparing the length L1 of the base portion 56b and the width W2 of the piezoelectric vibrator 52, the relation L1>W2 is satisfied because L1 is equal to 2.5 mm and W2 is equal to 2.0 mm. Furthermore, as for the piezoelectric acceleration sensor 50, when comparing the width W1 of the base portion 56b, the length L2 of the piezoelectric vibrator 52 and the length L3 of the metallic sheet 55, the relation (L3−L2)/2>W1 is satisfied because W1 is equal to 0.5 mm, L2 is equal to 4.5 mm and L3 is equal to 6.0 mm.

Comparative Example

As Comparative Example, the piezoelectric acceleration sensor 91 having existing structures shown in FIG. 9 was made similarly. Specifically, the piezoelectric vibrator 92 was made similar to the piezoelectric vibrator 52a of Example 1. The circuit board 96 having a rectangular shape of 6.0 mm×2.5 mm and a width of 0.5 mm was made of an alumina material. A general amplifier circuit using Field Effect Transistor (FET) is installed on the circuit board 96. In addition, a case 97 was made. The case 97 was provided with a ditch 97b at a middle part thereof so that the piezoelectric vibrator 92 could vibrate and could be bent at the middle part. The piezoelectric vibrator 92 was glued to the case 97 by an adhesive so that the both-ends support structure was formed.

The resonant frequency of the piezoelectric vibrator 92 supported by the aforementioned structures was about 65 kHz.

Then, the lead 99a, the lead 99b and the output cable 100, which was a single-core coaxial cable, were soldered to be connected to the circuit board 96. The lead 99a electrically connects the upper electrode 93a of the piezoelectric vibrator 92 and the amplifier circuit with each other. The lead 99b electrically connects the lower electrode 93b of the piezoelectric vibrator 92 and the amplifier circuit with each other. The output cable 100 is used to supply power current to the amplifier circuit and to send out signals.

Finally, the case 97, which has enough size to accommodate the circuit board, and the case-cover 98 were made of a SUS304 material. The circuit board 96 was glued to the case 97 by a thermosetting epoxy resin. The case-cover 98 was fixed to the case 97 by press-fitting so that the piezoelectric acceleration sensor 91 was made.

The characteristic of the output sensitivity of the piezoelectric acceleration sensor of each of Example 1, Example 2 and Comparative Example was evaluated. Specifically, each of the produced piezoelectric acceleration sensors was fixed to a shaker by a double sided tape. A signal was supplied to the shaker from a signal generator so that predetermined acceleration was generated. Meanwhile, the output from each of the piezoelectric acceleration sensors was measured. The amplification efficiencies of the respective amplifier circuits installed on the circuit boards of the piezoelectric acceleration sensors were set to a same value.

The measurement results for the piezoelectric acceleration sensors of Example 1, Example 2 and Comparative example are shown in Table 1.

TABLE 1

| | Output Sensitivity [mV/G] | Size of External Form of the Sensor [mm] | Size of the Circuit Board [mm] | | Number of the Leads | L1 > W2 [mm] | (L3−L2)/2 > W1 [mm] |
| --- | --- | --- | --- | --- | --- | --- | --- |
| | | | Circuit portion | Base portion | | | |
| Example 1 | 30 | 7.5 × 7.5 × 2.5 | 6.0 × 3.0 | (2.5 × 0.5) × 2 | 1 | 2.5 > 2.0 | — |
| Example 2 | 300 | 7.5 × 7.5 × 2.5 | 6.0 × 3.0 | (2.5 × 0.5) × 2 | 1 | 2.5 > 2.0 | 0.75 > 0.5 |
| Comparative Example | 30 | 7.5 × 7.5 × 2.5 | 6.0 × 2.5 | — | 2 | — | — |

As can be seen from Table 1, the piezoelectric acceleration sensor of Example 1 has less number of the leads, which cause quality variations, while having equivalent ability to the (existing) piezoelectric acceleration sensor of Comparative Example. Moreover, the area of the circuit board (i.e. the area of the part where the amplifier circuit can be installed) is wide. Therefore, it is possible to further reduce the size and to further improve the output sensitivity by improving the amplifier circuit to be installed.

As can be seen from Table 1, while the piezoelectric acceleration sensor of Example 2 still has similar size as the (existing) piezoelectric acceleration sensor of Comparative Example, its output sensitivity is improved to be about ten times as high as usual.

As can be seen from the above description, according to the present invention, it is possible to provide a piezoelectric acceleration sensor having a reduced size, a low price, superior mass productivity and superior output sensitivity.

While it is mentioned above about the present invention specifically based on examples or the like, the present invention is not limited to these. If a member or a structure is modified without departing from the spirit of the present invention, it is within the present invention. In other words, various modifications and rectifications which may be made obviously by those skilled in the art are also included in the present invention.

INDUSTRIAL APPLICABILITY

A piezoelectric acceleration sensor according to the present invention can be used to detect vibration of various electronic equipments or impact applied to the various electronic equipments.

REFERENCE SIGNS LIST 50, 50a piezoelectric acceleration sensor
51 piezoelectric acceleration sensor
52, 52a piezoelectric vibrator (electromechanical transducer element)
53 piezoelectric ceramic plate (piezoelectric element)
53a upper electrode
53b lower electrode
53c, 53d principal surface
55 metallic sheet 55a upper surface
55b lower surface
55c supported portion
56 circuit board
56a circuit portion
56b base portion
56c upper surface
56d lower surface
57 case
57a accommodating space
57b support surface
58 case-cover
59 lead
60 output cable
91 piezoelectric acceleration sensor
92 piezoelectric vibrator (electromechanical transducer element)
93 piezoelectric ceramic plate (piezoelectric element)
93a upper electrode
93b lower electrode
96 circuit board
97 case
97b ditch
99a, 99b lead

What is claimed is:

1. A piezoelectric acceleration sensor comprising:
a piezoelectric element;
a metallic sheet; and
a circuit board, wherein:
the piezoelectric element is polarized in an upper-to-lower direction;
the circuit board includes a circuit portion and a roughly flat shaped base portion, the base portion protruding from an end portion of the circuit portion; and
one of surfaces of the metallic sheet is fixed to and supported by a surface of the base portion, the piezoelectric element being fixed to and supported by a remaining one of the surfaces of the metallic sheet such that the piezoelectric element and the base portion do not overlap each other in the upper-to-lower direction;
the metallic sheet is partially located on the base portion in the upper-to-lower direction;
the piezoelectric element is located on the metallic sheet in the upper-to-lower direction; and
the piezoelectric element is apart from the base portion in a left-to-right direction perpendicular to the upper-to-lower direction.

2. The piezoelectric acceleration sensor according to claim 1, wherein as seen along the upper-to-lower direction, the metallic sheet is located to be apart from the circuit portion so as not to be brought into contact with the circuit portion in a case where the metallic sheet is bent by acceleration.

3. The piezoelectric acceleration sensor according to claim 1, wherein as seen along the upper-to-lower direction, the piezoelectric element is located to be apart from the base portion so as to be bent entirely to one side by acceleration.

4. The piezoelectric acceleration sensor according to claim 3, wherein a distance between the piezoelectric element and the base portion as seen along the upper-to-lower direction is designed so that the metallic sheet does not practically generate an undesirable vibration by acceleration.

5. The piezoelectric acceleration sensor according to claim 1, wherein the metallic sheet is located near the circuit portion as compared with a head of the base portion.

6. The piezoelectric acceleration sensor according to claim 1, wherein:
the base portion includes two base portions which project in parallel to each other in a common plane from the end portion of the circuit portion; and
opposite end portions in a lengthwise direction of the one of the surfaces of the metallic sheet are fixed to and supported by the surfaces of the base portions, respectively.

7. The piezoelectric acceleration sensor according to claim 6, wherein as seen along the upper-to-lower direction, distances between the piezoelectric element and the respective base portions are substantially the same.

8. The piezoelectric acceleration sensor according to claim 1, wherein the piezoelectric element and the metallic sheet constitute a unimorph piezoelectric vibrator.

9. The piezoelectric acceleration sensor according to claim 1, wherein the piezoelectric element constitutes a bimorph piezoelectric vibrator.

10. The piezoelectric acceleration sensor according to claim 1, further comprising a case, wherein:
the case has an accommodating space formed therewithin, the accommodating space having a support surface; and
the base portion has an opposite surface which is opposite, in the upper-to-lower direction, to the surface which supports the metallic sheet, the opposite surface being fixed to and supported by the support surface.

* * * * *